United States Patent
Seurin (10) Patent No.: US 12,149,050 B2
(45) Date of Patent: Nov. 19, 2024

(54) LOW DIVERGENCE VERTICAL CAVITY SURFACE EMITTING LASERS, AND MODULES AND HOST DEVICES INCORPORATING THE SAME

(71) Applicant: ams Sensors Asia Pte. Ltd., Singapore (SG)

(72) Inventor: Jean-Francois Seurin, Princeton Junction, NJ (US)

(73) Assignee: AMS SENSORS ASIA PTE. LTD., Singapore (SG)

(*) Notice: Subject to any disclaimer, the term of this patent is extended or adjusted under 35 U.S.C. 154(b) by 949 days.

(21) Appl. No.: 17/259,426

(22) PCT Filed: Aug. 13, 2019

(86) PCT No.: PCT/SG2019/050397
§ 371 (c)(1),
(2) Date: Jan. 11, 2021

(87) PCT Pub. No.: WO2020/036535
PCT Pub. Date: Feb. 20, 2020

(65) Prior Publication Data
US 2021/0281049 A1    Sep. 9, 2021

Related U.S. Application Data

(60) Provisional application No. 62/718,049, filed on Aug. 13, 2018.

(51) Int. Cl.
*H01S 5/183* (2006.01)
*G01S 7/481* (2006.01)
(Continued)

(52) U.S. Cl.
CPC ........ *H01S 5/18361* (2013.01); *G01S 7/4815* (2013.01); *G01S 17/08* (2013.01);
(Continued)

(58) Field of Classification Search
CPC ..................................................... H01S 5/3416
(Continued)

(56) References Cited

U.S. PATENT DOCUMENTS 9,268,012 B2*  2/2016  Ghosh ................... G01S 17/894
2005/0271113 A1  12/2005  Song et al.
(Continued)

FOREIGN PATENT DOCUMENTS

CN          1707889 A     12/2005
JP        2005259951 A     9/2005
(Continued)

OTHER PUBLICATIONS

Taiwanese Office Action of the Intellectual Property Office for Application No. 108128653 dated Oct. 6, 2022 (16 pages including English translation).
(Continued)

*Primary Examiner* — Tuan N Nguyen
(74) *Attorney, Agent, or Firm* — Viering, Jentschura & Partner mbB (57) ABSTRACT

The disclosure describes VCSELs operable to produce very narrow divergent light beams. The narrow divergent beam can be obtained, in part, by incorporating an additional epitaxial layer so as to increase the cavity length of the VCSEL. The increased cavity length can result in higher power in fewer larger diameter transverse modes, which can significantly reduce the output beam divergence. The additional epitaxial layer can be incorporated, for example, into a top-emitting VCSEL or bottom-emitting VCSEL.

19 Claims, 6 Drawing Sheets

(51) Int. Cl.
  *G01S 17/08* (2006.01)
  *H01S 5/34* (2006.01)
  *H01S 5/42* (2006.01)

(52) U.S. Cl.
  CPC ........ *H01S 5/18305* (2013.01); *H01S 5/3416* (2013.01); *H01S 5/423* (2013.01)

(58) Field of Classification Search
  USPC .................................................. 372/50.124
  See application file for complete search history.

(56) References Cited

U.S. PATENT DOCUMENTS

2014/0247853 A1* 9/2014 Deppe ................ H01S 5/18305
                                                              372/50.11
2015/0260830 A1  9/2015 Ghosh et al.

FOREIGN PATENT DOCUMENTS

| TW | 200644368 A | 12/2006 |
| WO | 2006136346 A1 | 12/2006 |
| WO | 2010067261 A1 | 6/2010 |
| WO | 2012050146 A1 | 4/2012 |

OTHER PUBLICATIONS

Chinese Patent Office Action for Application No. 201980053498.9 dated Jul. 14, 2023 (12 pages).
International Search Report and Written Opinion for Application No. PCT/SG2019/050397 dated Oct. 28, 2019 (17 pages).
Serkland et al., "Mode selection and tuning of single-frequency short-cavity VECSELs", Proceedings of SPIE, vol. 10552, Feb. 2018, 11 pages.

* cited by examiner

LOW DIVERGENCE VERTICAL CAVITY SURFACE EMITTING LASERS, AND MODULES AND HOST DEVICES INCORPORATING THE SAME

CROSS-REFERENCE TO RELATED APPLICATION(S)

The present application is the U.S. national stage entry, under 35 U.S.C. § 371 of International Application No. PCT/SG2019/050397, filed Aug. 13, 2019, which claims the benefit of priority of U.S. Provisional Patent Application No. 62/718,049, filed on Aug. 13, 2018. The contents of the earlier application are incorporated here by reference in their entirety.

FIELD OF THE DISCLOSURE

The present disclosure relates to optical illumination sources including very low divergence vertical cavity surface emitting lasers (VCSELs).

BACKGROUND

A VCSEL can provide a small, compact, powerful laser source for various illumination applications. The use of VCSELs as an illumination source for structured light imaging systems, light detection and ranging (LIDAR) systems, and other types of 3D sensing and imaging systems, is being applied in a rapidly growing field of applications.

For example, a typical method for proximity or distance detection of objects involve illuminating an object with a light source, such as an LED, and measuring the intensity of the light reflected back to a detector located near the source. The reflected light intensity at the detector reduces as the object is moved further away from the light source and detector. The method relies on good object illumination from an intense well-collimated optical source as well as known reflectance of the objects. Differences in reflectance and even shapes of objects tend to change the detected light resulting in errors in distance measurement. Some light sources currently available at a reasonable cost produce a light beam that has a relatively low intensity and/or is highly divergent, which limits the distance that can be measured accurately because the reflected intensity is low at greater distances and becomes below the detection limit of the detector or is indistinguishable from ambient light levels.

A VCSEL generally can produce lower divergent beams, for example, than a light emitting diode or other non-coherent sources, and some modules (e.g., proximity sensors) have been developed taking advantage of the reduced divergence of the VCSEL output beam. Nevertheless, the divergence of the standard VCSEL is typically about fifteen degrees, full-width half-maximum, and this can limit the sensitivity of such proximity sensors.

The advent of mobile phones and similar tablet computers has created the need for accurate distance sensing for camera auto-focus applications and other similar systems. The sensor has to be miniaturized to be compatible with the compact nature of the mobile phones. This creates problems because it puts the optical detector close to the optical source. With a divergent light source, reflections from the protective window can propagate back to the detector, thereby severely limiting the object distance detection limit of the sensor. The increasing complexity of the mobile phone camera systems is demanding more accurate proximity sensors while maintaining or even reducing further the miniature footprint.

SUMMARY

This disclosure describes VCSELs that are operable, in some cases, to produce very narrow divergent light beams. In accordance with some implementations, the disclosure describes an optical source including a VCSEL operable to generate a narrow divergence source beam having a full-width half-maximum beam divergence, for example, of no more than 10 degrees. Some implementations provide even narrower divergent beams in the range of 0.5 to 5 degrees.

In broad terms, the narrower divergent beam can be obtained, in part, by incorporating an additional epitaxial layer so as to increase the cavity length of the VCSEL. The increased cavity length can result in higher power and in fewer larger diameter transverse modes, which can significantly reduce the output beam divergence. The additional epitaxial layer can be incorporated, for example, into a top-emitting VCSEL or bottom-emitting VCSEL.

In one aspect, for example, the disclosure describes a vertical cavity surface emitting laser (VCSEL) that includes a substrate, and an epitaxial VCSEL structure on the substrate. The epitaxial VCSEL structure includes a resonant cavity, including a gain region, disposed between a bottom mirror and a partially reflecting middle mirror, the partially reflecting middle mirror being further from the substrate than the bottom mirror. The epitaxial VCSEL structure also includes an additional epitaxial layer disposed between the partially reflecting middle mirror and a top mirror, the top mirror being further from the substrate than the partially reflecting middle mirror, and the additional epitaxial layer having a thickness in a range of 5 µm-100 µm.

In another aspect, the disclosure describes a vertical cavity surface emitting laser (VCSEL) that includes a substrate, and an epitaxial VCSEL structure on the substrate. The epitaxial VCSEL structure includes a resonant cavity, including a gain region, disposed between a top mirror and a partially reflecting middle mirror, the top mirror being further from the substrate than the partially reflecting middle mirror. The epitaxial VCSEL structure also includes an additional epitaxial layer disposed between the partially reflecting middle mirror and a bottom mirror, the partially reflecting middle mirror being further from the substrate than the bottom mirror, and the additional epitaxial layer having a thickness in a range of 5 µm-100 µm.

Some implementations include one or more of the following features. For example, in some cases, the top mirror is partially reflecting, and the VCSEL is operable as a top-emitting VCSEL to produce an output beam emitted through the top mirror. In other cases, the bottom mirror is partially reflecting, and the VCSEL is operable as a bottom-emitting VCSEL to produce an output beam emitted through the bottom mirror.

Some implementations include one or more of the following features. For example, in some implementations, the additional epitaxial layer has a thickness in a range of 5 µm-50 µm. In some instances, the VCSEL is operable to produce a light beam that is emitted from the VCSEL, the light beam having a full-width half-maximum beam divergence of no more than 10 degrees. In some cases, the light beam has a full-width half-maximum beam divergence in a range of 0.5-5 degrees. The VCSEL can include an aperture to concentrate current in a particular part of the gain region, wherein the partially reflecting middle mirror is disposed between the gain region and the additional epitaxial layer.

In some instances, the VCSEL is operable to produce a light beam that is emitted from the VCSEL, the additional epitaxial layer being transparent to a wavelength of the light beam, and the substrate being opaque to the wavelength of the light beam. The additional epitaxial layer may be composed, for example, of AlGaAs, and the substrate may be composed, for example, of GaAs. In some implementations (e.g., where the substrate is composed of GaAs), the additional epitaxial layer is transparent to a wavelength less than 950 nm.

Multiple VCSELs, each of which has the additional epitaxial layer, can be integrated into an array of VCSELs.

The disclosure also describes an optical sensor module that includes an optical source including a VCSEL operable to generate a narrow divergence source beam directed through a window toward an object. The module also includes an optical detector to sense light reflected back from the object illuminated by the narrow divergence source beam. A computation device is operable to determine a distance to the object or a physical characteristic of the object based at least in part on a signal from the optical detector.

The disclosure further describes a host device including an optical sensor module that includes an optical source including a VCSEL operable to generate a narrow divergence source beam. The host device is operable to use data obtained by the optical detector of the optical sensor module for one or more functions executed by the host device.

Other aspects, features and advantages will be readily apparent from the following detailed description, the accompanying drawings and the claims.

DETAILED DESCRIPTION

Figure 1:
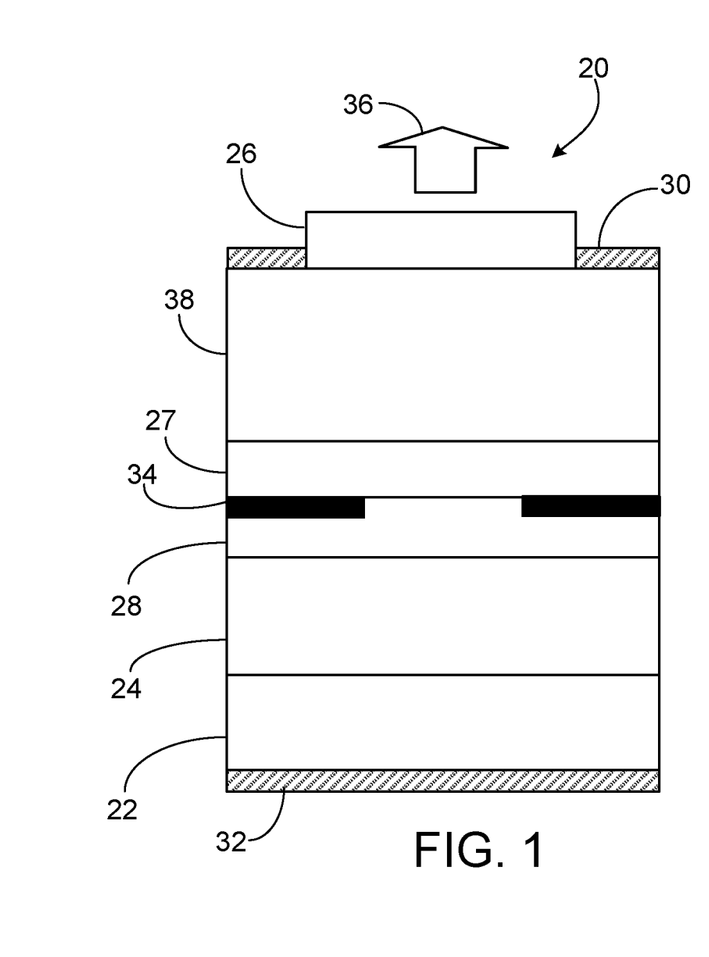
FIG. 1 illustrates a top-emitting VCSEL structure.

As shown in FIG. 1, a top-emitting VCSEL device 20 includes a VCSEL structure grown epitaxially on a substrate 22. The VCSEL resonant cavity is formed between a first lower mirror 24 and a second upper mirror 26. The bottom mirror 24 can be implemented, for example, as high-reflectivity distributed Bragg reflector (DBR). The top mirror 26, which can be implemented, for example, as a DBR or as a multi-layer dielectric coating, has a lower reflectivity such that it is only partially reflecting, thereby allowing an output beam 36 to exit through the top of the VCSEL (i.e., through the end of the VCSEL 20 furthest from the substrate 22). A laser gain region 28 comprising a stack or group of multiple quantum wells is disposed between the mirrors 24, 26. The gain (i.e., active) region 28 is activated by a current flowing between top and bottom contacts (e.g., electrodes) 30, 32. In some designs, the quantum wells in the gain region 28 are activated by shining a laser beam on them to pump the carriers optically. In a VCSEL activated by current, an aperture 34 can be used to concentrate the current in the center region. This aperture 34 can be formed, for example, by oxidation, although other techniques such as ion implantation can be used to form the electrically insulating region around the aperture. The high gain results in laser oscillation between the mirrors 24, 26.

The VCSEL device 20 preferably also includes a third (middle) mirror 27 disposed between the gain region 28 and the top mirror 26. Thus, the VCSEL cavity is a 3-mirror cavity. The middle mirror 27 can be implemented, for example, as a DBR. The reflectivity of the middle mirror 27 should be designed such that the middle mirror by itself (i.e., in the absence of the top mirror 26) is insufficient to achieve lasing, the combined reflectivity of the middle mirror 27 and the top mirror 26 allows the VCSEL 20 to achieve lasing.

An epitaxial layer 38 is disposed between the middle mirror 27 and the top mirror 26 such that both the middle mirror 27 and the epitaxial layer 38 are disposed between the gain region 28 and the top mirror 26. As illustrated in the example of FIG. 1, the epitaxial layer 38 can be sandwiched between the middle mirror 27 and the top mirror 26 such that the epitaxial layer 38 is in direct contact with both the middle mirror 27 and the top mirror 26. The addition of the epitaxial layer 38 can help reduce the divergence of the output beam 36. Preferably, the epitaxial layer 38 is made relatively thick (e.g., 5 µm-25 µm; and, in some cases, even thicker, such as up to 50 µm or even up to 100 µm). In some instances, the epitaxial layer 38 has a thickness of about 25 µm. Other thicknesses may be appropriate for some implementations.

In some implementations, the epitaxial layer 38 is composed of a semiconductor material that is transparent to at least some wavelengths for which the substrate 22 is opaque. For example, in some implementations, the substrate 22 is composed of gallium arsenide (GaAs), and the epitaxial layer 38 is composed of aluminum gallium arsenide (AlGaAs). In such cases, the alloy composition (e.g., the percentage of aluminum) of the epitaxial layer 38 can be controlled such that the AlGaAs layer has a particular band gap that renders the AlGaAs layer transparent to wavelength(s) of light produced by the VCSEL. This allows the VCSEL to be tailored to emit relatively short wavelengths of light (e.g., less than 950 nm), even though the GaAs substrate 22 is opaque to such wavelengths.

The present techniques can be applied, for example, to top emitting VCSELs and, as noted above, can be used advantageously for VCSELs operable to emit light of shorter wavelengths (e.g., <950 nm). In some implementations, the epitaxial layer 38 is composed of other semiconductor compounds that are substantially lattice matched to the adjacent semiconductor material(s). For example, in some cases, the epitaxial layer 38 is composed of InGaAsP, GaN, or GaAsP including ZnSe.

Figure 2:
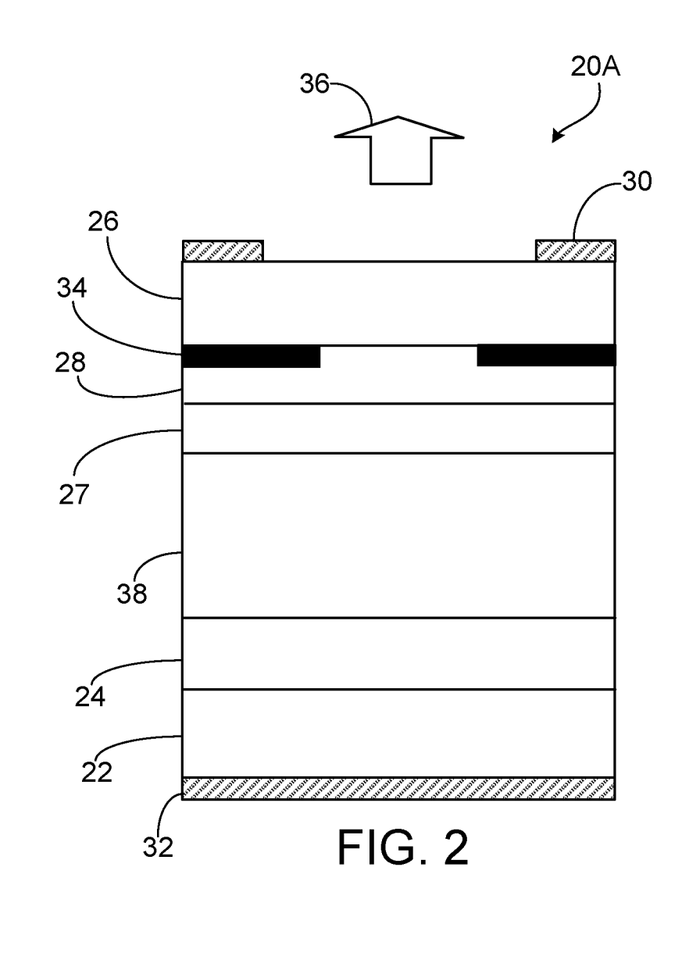
FIG. 2 illustrates another top-emitting VCSEL structure.

FIG. 2 illustrates another example of a VCSEL device 20A which is similar to FIG. 1, except that the thick epitaxial layer 38 is grown closer to the bottom side of the VCSEL cavity. As shown in FIG. 2, the epitaxial layer 38 is disposed between, and in contact with, the bottom mirror 24 and the middle mirror 27, all of which are disposed between the substrate 22 and the gain region 28. The epitaxial layer 28 of FIG. 2 can have a similar thickness and composition as described above in connection with the VCSEL device of FIG. 1. Placing the gain region 28 closer to the top (i.e., light emitting) surface of the VCSEL device can be advantageous in some cases. For example, the output beam 36 can have a smaller diameter.

Figure 3:
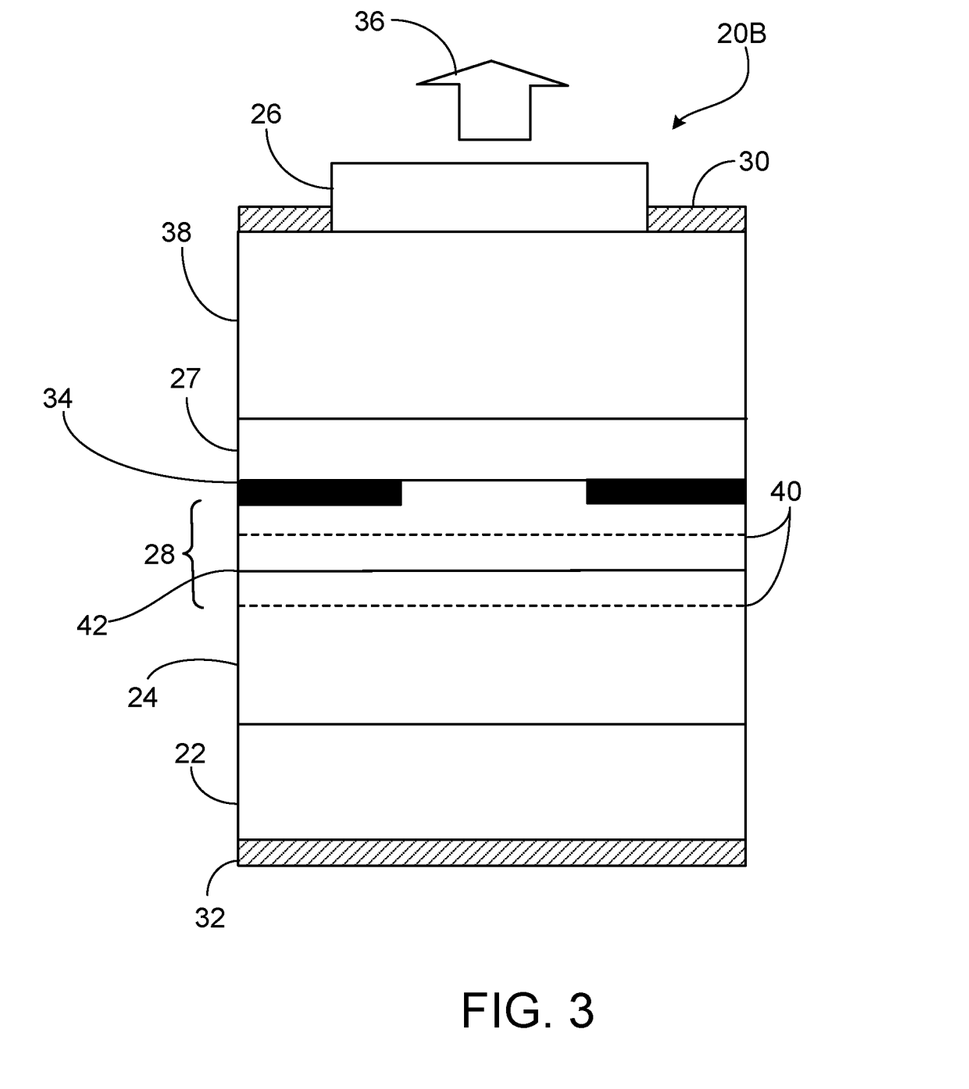
FIG. 3 illustrates a further top-emitting structure.

The present techniques for reducing divergence of the VCSEL output beam can be combined with other techniques that help reduce the divergence. For example, in some instances, the gain region 28 can be increased in length by using multiple gain sections instead of just a single gain section group of multiple quantum wells. The gain sections can be separated from one another by tunnel junction(s), with each gain section being placed at the maximum intensity point of the resonant cavity standing wave so that the cavity length increases in half wavelengths by the number of added gain sections. The resulting VCSEL device can have a lower divergent beam because of the longer cavity, and also can have higher intensity because of the higher gain from the multiple gain sections. An example is illustrated in FIG. 3, which shows a VCSEL device 20B similar to that of FIG. 1, but whose gain region 28 includes multiple quantum well groups 40 separated by a tunnel junction 42. Such stacked gain regions can, in some cases, produce higher gain so as to produce higher output power and efficiency, and may also reduce capacitance for higher modulation frequency. The foregoing feature of a gain region having multiple stacked gain sections can be incorporated into any of the implementations described in this disclosure, including those described below.

Further, in some cases, the cavity length can be extended by increasing the number of DBR mirrors in a stack for the bottom mirror 24 (or the top mirror 26). For example, in GaAs/GaAlAs DBRs, reducing the Al concentration will need a larger number of mirror pairs for a particular reflectivity, thereby increasing the cavity length. The increase in cavity length will reduce the number of higher order modes and will thus reduce the divergence angle. In some instances, the DBR mirror stack includes multiple DBR mirror pairs composed of alternating layers of different materials having a refractive index difference in a range of 1-7%. The foregoing features can be incorporated into any of the implementations described in this disclosure, including those described below.

Figure 4:
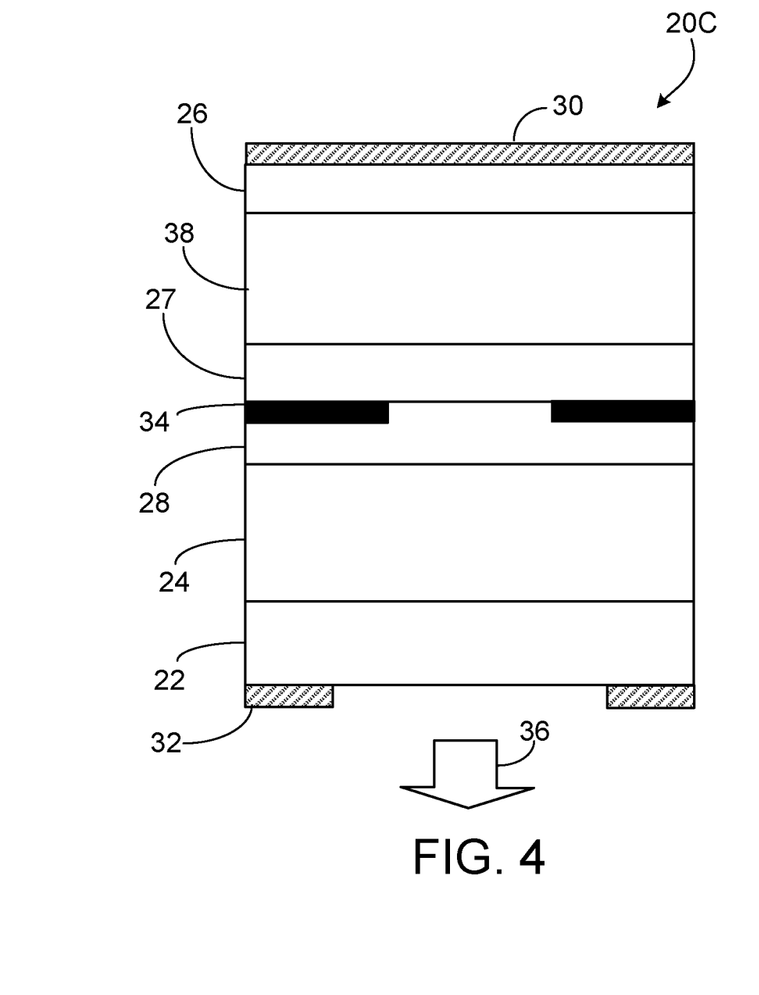
FIG. 4 illustrates a bottom-emitting VCSEL structure.
Figure 5:
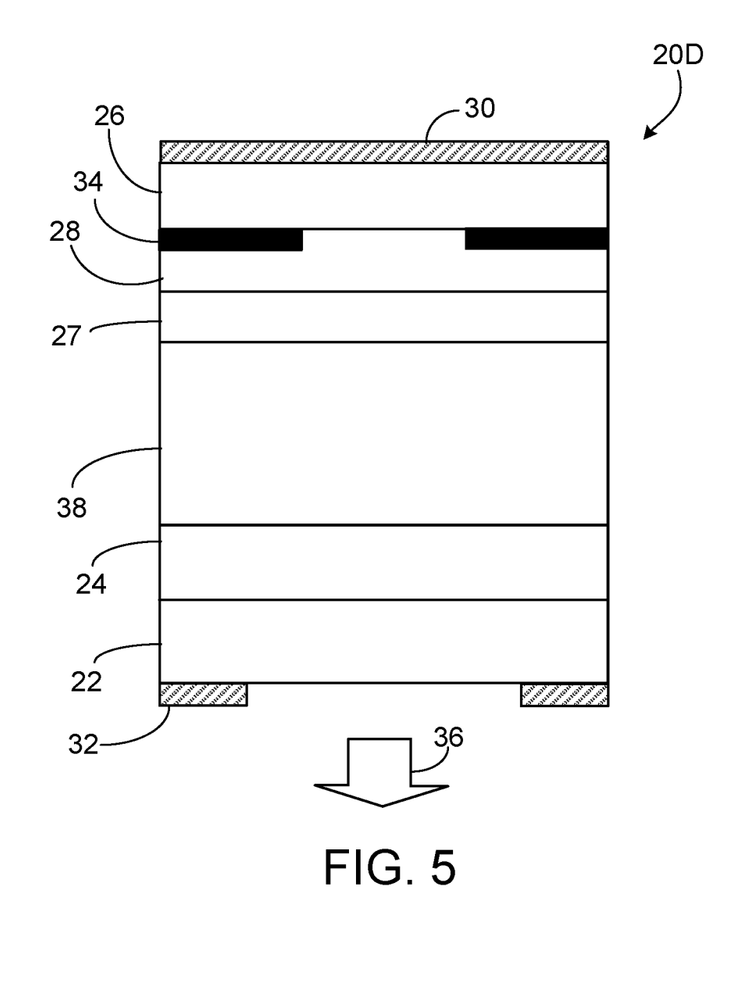
FIG. 5 illustrates another bottom-emitting VCSEL structure.

The addition of a relatively thick epitaxial layer also can be incorporated into bottom-emitting VCSEL structures. FIGS. 4 and 5 illustrate examples of such VCSEL devices. In FIGS. 4 and 5, each of the bottom and middle mirrors 24, 27 is partially reflecting, and the beam 36 is emitted from the VCSEL device through the GaAs or other substrate 22. As shown in FIG. 4, the VCSEL device 20D includes an epitaxial layer 38 disposed between the middle mirror 27 and the top mirror 26. Both the middle mirror 27 and the epitaxial layer 38 are disposed between the gain region 28 and the top mirror 26. On the other hand, as shown in FIG. 5, the VCSEL device 20E includes an epitaxial layer 38 disposed between the bottom mirror 24 and the middle mirror 27. In this implementation, both the bottom mirror 24 and the middle mirror 27, as well as the epitaxial layer 38, are disposed between the substrate 22 and the gain region 28. The epitaxial layers 28 of FIGS. 4 and 5 can have a similar thickness and composition as described above in connection with the VCSEL device of FIG. 1.

Bottom emitting VCSELs sometime operate to emit longer wavelengths, with respect to which the substrate 22 is transparent. An advantage that can be achieved in some instances (e.g., the VCSEL device 20D of FIG. 4) is better cooling because a heat sink can be placed on the top contact 30, closer to the VCSEL structure. Further, in the example of FIG. 5, the thick epitaxial layer 38 is grown on the bottom side of the VCSEL cavity such that the gain region 38 is closer to the top surface of the VCSEL device. This can result in even better cooling of the gain region 38 in some situations.

In each of the foregoing implementations, the additional epitaxial layer 38 is composed of a semiconductor material (e.g., a semiconductor compound) whose composition differs from that of the adjacent mirror structures.

Figure 6A:
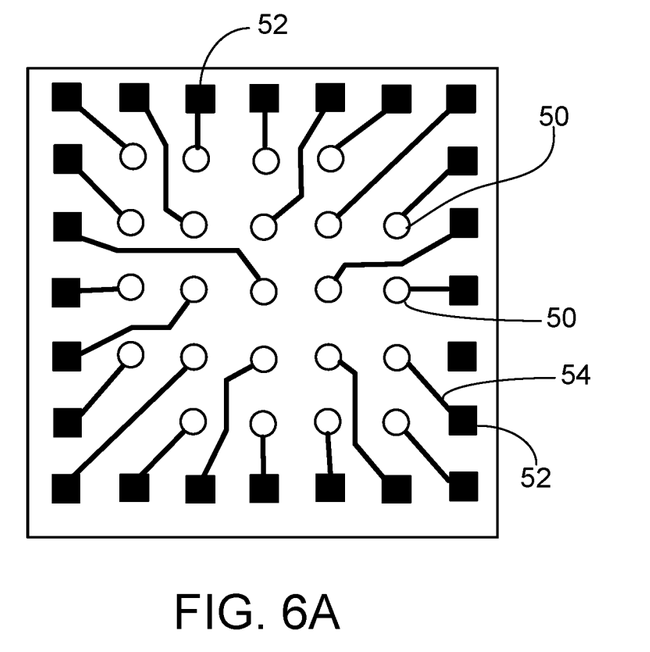
FIGS. 6A and 6B illustrate examples of VCSEL arrays.
Figure 6B:
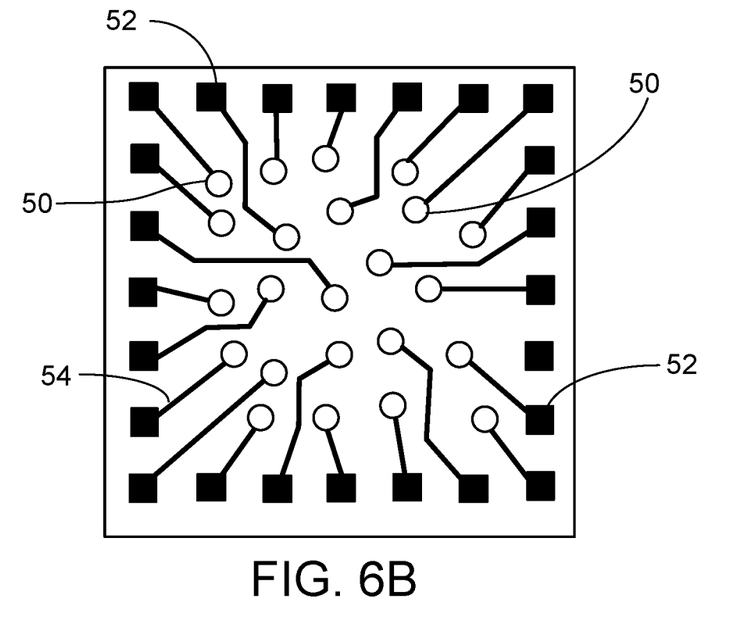

Multiple VCSELs, each of which has an additional epitaxially grown layer as described above, can be integrated into a VCSEL array. For example, the VCSELs 50 in the array may be regularly spaced so that they are arranged in a regular pattern (FIG. 6A) or randomly spaced so that they are in a random arrangement (FIG. 6B). The VCSELs 50 can be connected by respective electrical connections 54 to respective electrical contacts 52 such that the VCSELs are addressable, and can be activated or deactivated, either individually or in groups.

Figure 7:
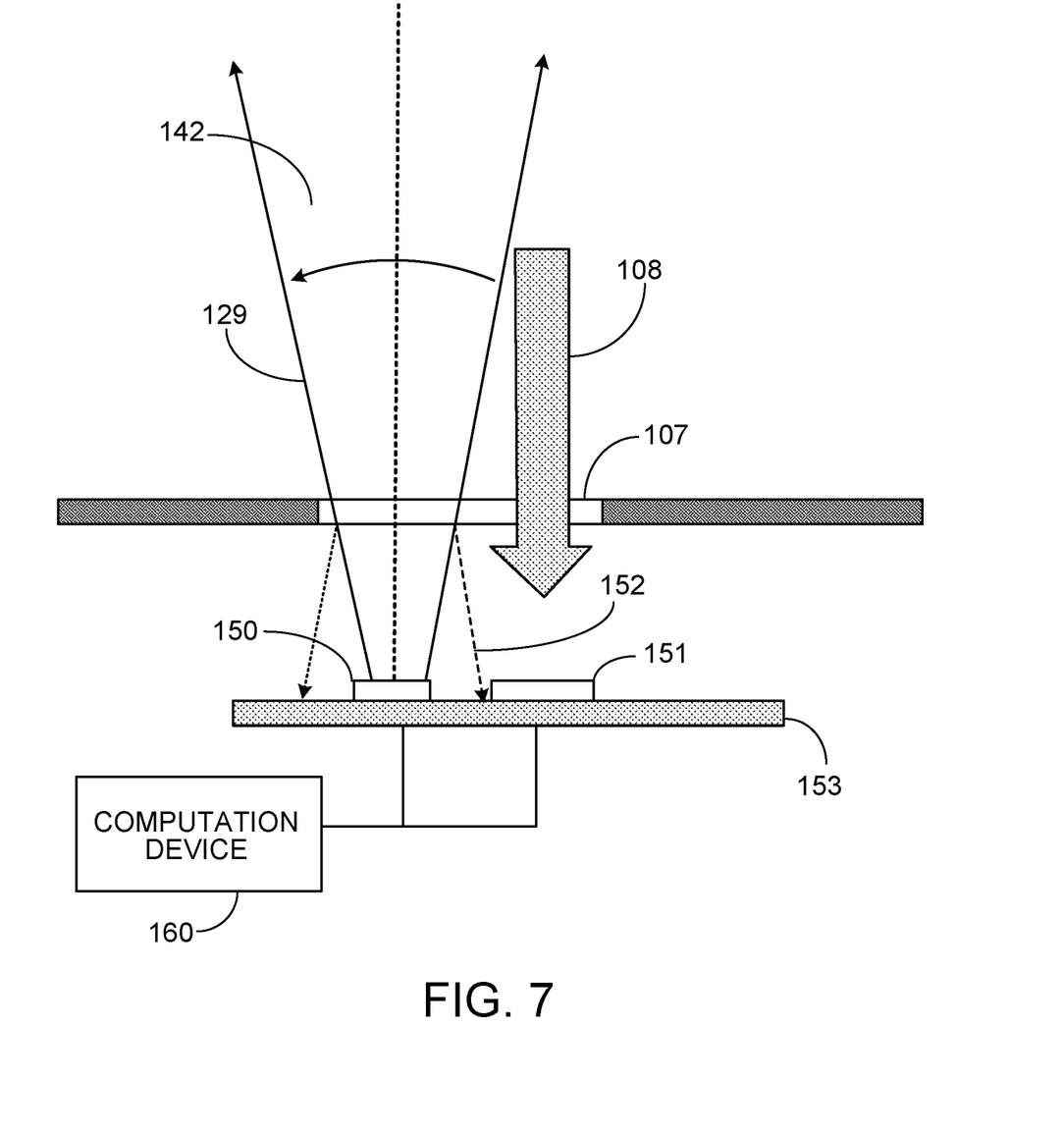
FIG. 7 illustrates an example of a proximity sensor module that includes a low beam divergence VCSEL.

FIG. 7 illustrates an example of a proximity sensor module that includes a low beam divergence VCSEL source such as one of those described above (e.g., FIG. 1, 2, 3, 4 or 5). The VCSEL 150 and a light detector (e.g., a photodetector) 151 are mounted close together on a common substrate 153. The VCSEL beam propagates out through a window 107 and reflects and scatters off an object outside the module. A portion of the backscatter radiation 108 returns through the window 107 and is captured by the detector 151. The signal intensity from the detector is used by processing circuitry to determine the distance of the object from the sensor. In the illustrated example, the VCSEL beam divergence is sufficiently small that the specular reflection 152 from the window 107 returns close to the VCSEL and does not fall on the detector 151. Thus, this reflection 152 does not add a noise signal to modify the backscatter signal received by the detector 151 and so does not degrade the distance determination.

The illustrated optical sensor module thus includes, as an optical source, a VCSEL device operable to generate a narrow divergence source beam directed through a window toward an object, the narrow divergence source beam having, in some cases, a full-width half-maximum beam divergence of no more than 10 degrees. The module further includes an optical detector to sense light reflected back from the object illuminated by the narrow divergence source beam, and a computation device 160 including processing circuitry operable to determine a distance to the object or a physical characteristic of the object based at least in part on a signal from the optical detector. The processing circuitry can be implemented, for example, as one or more integrated circuits in one or more semiconductor chips with appropriate digital logic and/or other hardware components (e.g., read-out registers; amplifiers; analog-to-digital converters; clock drivers; timing logic; signal processing circuitry; and/or microprocessor). The processing circuitry is, thus, configured to implement the various functions associated with such circuitry.

Some implementations provide narrower divergent beams, for example, in the range of 0.5 to 5 degrees to provide much higher proximity sensing accuracy in a smaller footprint assembly.

Additional benefits can be obtained by using the low divergence beam from the VCSEL. The beam that impinges on the object is relatively small, thereby resulting in a higher incident power density. Therefore, the scattered and reflected power is proportionally higher. These features can result in improved distance measurement resolution with shorter pulses, as well as the ability to measure longer distances. These benefits can be accomplished in a small footprint since a small distance between the VCSEL and detector can be maintained.

The foregoing description is made in relation to proximity sensing of objects for applications such as self-focusing of cameras and other motion detection applications. However, other applications of the technology will be readily apparent. For example, the very low divergence VCSEL source beam also can be used for health monitoring by measuring, e.g., blood flow, heart pulse rate and/or chemical composition. In these applications, the source beam is directed at the sample or object, and the detector measures quantity of reflected light at one or more wavelengths or fluctuation of reflected light which correlates with pulsing effects from a heart-beat. It can be equally important in these other applications for the VCSEL to have the same very low divergence properties described above. The sensitivity of these applications likewise can be improved by incorporating the technology of this disclosure. The present technology also can be useful, for example, for other optical sensing modules, such as for gesture sensing or recognition.

VCSELs as described above, or modules incorporating one or more such VCSELs, can be integrated into a wide range of host devices such as smartphones, laptops, wearable devices, other computers, and automobiles. The host devices may include processors and other electronic components, and other supplemental modules configured to collect data, such as cameras, time-of-flight imagers. Other supplemental modules may be included such as ambient lighting, display screens, automotive headlamps, and the like. The host devices may further include non-volatile memory where instructions for operating the optoelectronic modules, and in some instances the supplemental modules, are stored.

Figure 8:
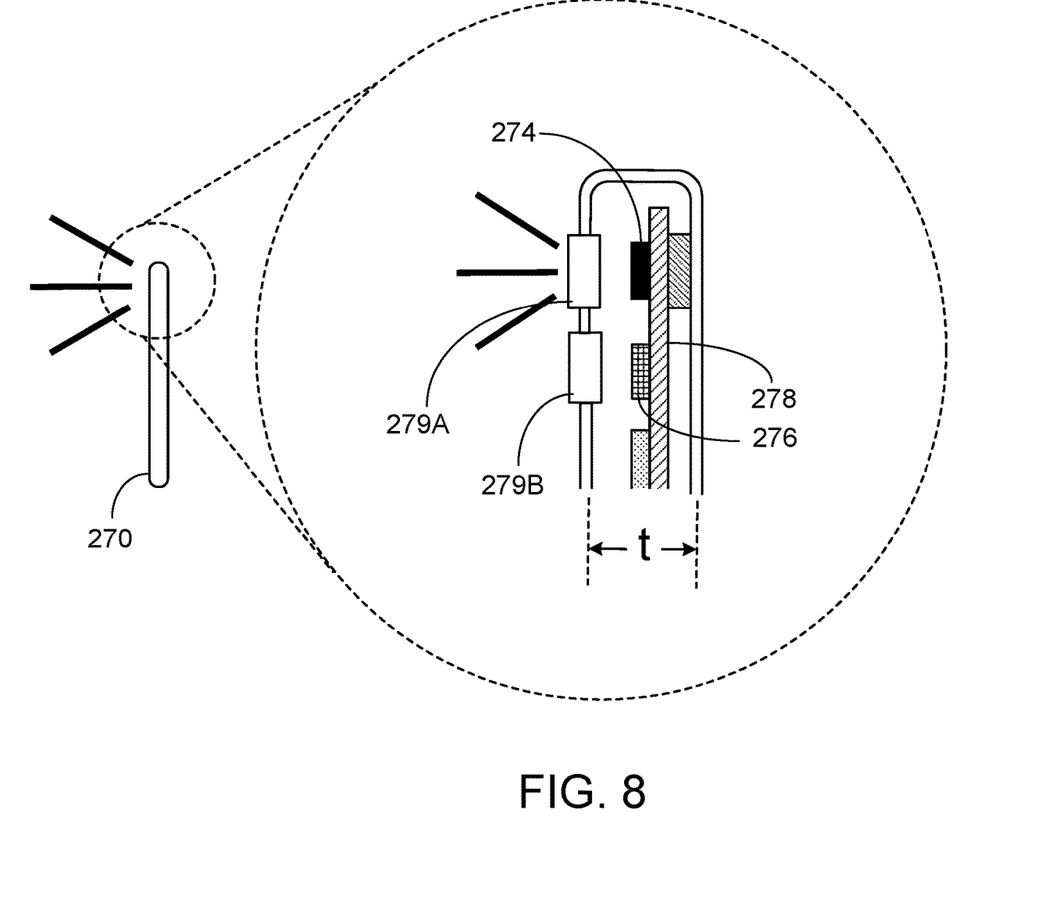
FIG. 8 illustrates an example of a host device that includes a low beam divergence VCSEL.

FIG. 8 illustrates a smartphone 270 as an example of a host device that includes a module for three-dimensional optical imaging and/or sensing. The module is operable to emit light and to detect incoming beams. The module includes a VCSEL light source 274 operable to produce a very low divergence beam as described above. The module further includes a sensor 276 operable to sense incoming beams. The VCSEL light source 274 and the sensor 276 can be mounted, for example, on a printed circuit board or other substrate 278. The module also can include projection optics 279A and/or collection optics 279B, which can be implemented, for example, as lenses or other passive optical elements. Signal processing circuitry is operable to process signals detected by the sensor 276 and to determine, for example, the distance to an object outside the smartphone 270 that reflects some of the light back toward the smartphone, and/or for gesture recognition.

As modules using the VCSELs described above can obtain more accurate data in some cases, and the data can be used for functions executed by the smartphones (e.g., screen response to user proximity), these and other functions can be more accurately performed, thereby conferring substantial advantages to the smartphone or other host device itself.

In some cases, multiple VCSELs, as described above, can be incorporated into an array of VCSELs. In some implementations, one or more VCSELs are arranged in a module operable to produce structured light.

Although a broad framework of the disclosure is described with reference to a few preferred embodiments, other implementations may be configured by applying combinations and sub-combinations of elements described in this disclosure. Accordingly, other implementations are within the scope of the claims.

What is claimed is:

1. A vertical cavity surface emitting laser (VCSEL) comprising:
  a substrate;
  an epitaxial VCSEL structure on the substrate, wherein the epitaxial VCSEL structure includes:
    a resonant cavity, including a gain region, disposed between a bottom mirror and a partially reflecting middle mirror, the partially reflecting middle mirror being further from the substrate than the bottom mirror; and
    an additional epitaxial layer disposed between the partially reflecting middle mirror and a top mirror, the top mirror being further from the substrate than the partially reflecting middle mirror, and the additional epitaxial layer having a thickness in a range of 5 μm-100 μm,
  wherein the VCSEL is operable to produce a light beam that is emitted from the VCSEL, the light beam having a full-width half-maximum beam divergence of no more than 10 degrees.

2. The VCSEL of claim 1 wherein the additional epitaxial layer has a thickness in a range of 5 μm-50 μm.

3. The VCSEL of claim 1 wherein the top mirror is partially reflecting, and the VCSEL is operable as a top-emitting VCSEL to produce an output beam emitted through the top mirror.

4. The VCSEL of claim 3 wherein the VCSEL is operable to produce a light beam that is emitted from the VCSEL, the additional epitaxial layer being transparent to a wavelength of the light beam, and the substrate being opaque to the wavelength of the light beam.

5. The VCSEL of claim 4 wherein the additional epitaxial layer is composed of AlGaAs, and the substrate is composed of GaAs.

6. The VCSEL of claim 4 wherein the substrate is composed of GaAs, and the additional epitaxial layer is transparent to a wavelength less than 950 nm.

7. The VCSEL of claim 1 wherein the bottom mirror is partially reflecting, and the VCSEL is operable as a bottom-emitting VCSEL to produce an output beam emitted through the bottom mirror.

8. The VCSEL of claim 1 wherein the VCSEL is operable to produce a light beam that is emitted from the VCSEL, the light beam having a full-width half-maximum beam divergence in a range of 0.5-5 degrees.

9. The VCSEL of claim 1 including an aperture to concentrate current in a particular part of the gain region, wherein the partially reflecting middle mirror is disposed between the gain region and the additional epitaxial layer.

10. The VCSEL of claim 1 wherein the gain region includes a plurality of stacked quantum well groups separated from one another by one or more tunnel junctions.

11. A VCSEL array comprising:
  a plurality of VCSELs in accordance with claim 1; and
  a plurality of contacts each of which is electrically connected to one or more of the VCSELs.

12. The VCSEL array of claim 11 wherein the VCSELs are arranged in a regular pattern.

13. The VCSEL array of claim 11 wherein the VCSELs are in a random arrangement.

14. An optical sensor module comprising:
an optical source including a VCSEL according to claim 1, the VCSEL being operable to generate a narrow divergence source beam directed through a window toward an object;
an optical detector to sense light reflected back from the object illuminated by the narrow divergence source beam; and
a computation device operable to determine a distance to the object or a physical characteristic of the object based at least in part on a signal from the optical detector.

15. A host device comprising an optical sensor module according to claim 14, wherein the host device is operable to use data obtained by the optical detector of the optical sensor module for one or more functions executed by the host device.

16. The host device of claim 15 wherein the host device is a smart phone.

17. A vertical cavity surface emitting laser (VCSEL) comprising:
a substrate;
an epitaxial VCSEL structure on the substrate, wherein the epitaxial VCSEL structure includes:
a resonant cavity, including a gain region, disposed between a top mirror and a partially reflecting middle mirror, the top mirror being further from the substrate than the partially reflecting middle mirror; and
an additional epitaxial layer disposed between the partially reflecting middle mirror and a bottom mirror, the partially reflecting middle mirror being further from the substrate than the bottom mirror, and the additional epitaxial layer having a thickness in a range of 5 μm-100 μm.

18. The VCSEL of claim 17 wherein the top mirror is partially reflecting, and the VCSEL is operable as a top-emitting VCSEL to produce an output beam emitted through the top mirror.

19. The VCSEL of claim 17 wherein the bottom mirror is partially reflecting, and the VCSEL is operable as a bottom-emitting VCSEL to produce an output beam emitted through the bottom mirror.

* * * * *